United States Patent
Babock et al.

[11] Patent Number: 5,864,176
[45] Date of Patent: Jan. 26, 1999

[54] ELECTRO-MECHNICAL SUBASSEMBLY HAVING A GREATLY REDUCED THERMAL RESISTANCE BETWEEN TWO MATING FACES BY INCLUDING A FILM OF LIQUID, THAT EVAPORATES WITHOUT LEAVING ANY RESIDUE, BETWEEN THE FACES

[75] Inventors: James Wittman Babock, Escondido; Jerry Ihor Tustaniwskyi, Mission Viej, both of Calif.

[73] Assignee: Unisys Corporation, Blue Bell, Pa.

[21] Appl. No.: 833,273

[22] Filed: Apr. 4, 1997

[51] Int. Cl.$^6$ ............................. H01L 23/34; H05K 1/00; H05K 1/56
[52] U.S. Cl. ................... 257/714; 257/712; 257/717; 361/688; 361/676
[58] Field of Search ..................... 257/714, 717, 257/712, 715; 361/687–688, 699, 676, 831

[56] References Cited

U.S. PATENT DOCUMENTS

| | | | |
|---|---|---|---|
| 5,104,661 | 4/1992 | Lau | 424/450 |
| 5,125,656 | 6/1992 | Fabanich | 273/63 |
| 5,172,049 | 12/1992 | Kiokawa et al. | 324/158 |
| 5,205,132 | 4/1993 | Fu | 62/208 |
| 5,297,621 | 3/1994 | Taraci et al. | 165/104 |
| 5,309,090 | 5/1994 | Lipp | 324/158 |
| 5,315,270 | 5/1994 | Jones | 324/158 |
| 5,420,521 | 5/1995 | Jones | 324/760 |
| 5,719,444 | 2/1998 | Tilton et al. | 257/98 |
| 5,734,872 | 3/1998 | Kelly | 395/500 |

FOREIGN PATENT DOCUMENTS 0 251 836  1/1988  European Pat. Off. ............... 257/714

*Primary Examiner*—Mahshid Saadat
*Assistant Examiner*—Jhihan B. Clark
*Attorney, Agent, or Firm*—Charles J. Fassbenger; Mark T. Starr; Steven R. Peterson

[57] ABSTRACT

A temperature control system includes an electro-mechanical subassembly having an enhanced thermal interface, which comprises: an electronic device which has a face that dissipates heat; a heat exchange member which has a face that mates with the heat dissipating face of the electronic device; and, a film of liquid, lying between the mating faces of the heat exchange member and the electronic device, which evaporates without leaving any residue at a temperature that is too low to damage the electronic device. Due to the presence of the liquid film, the thermal resistance between the mating faces of the heat exchange member and the electronic device is reduced by over 1000% from which it otherwise is when film is deleted.

11 Claims, 10 Drawing Sheets

EQUATION 1
$$M_d \dot{T}_d = (T_h - T_d) / \theta_{d-h} + P_d$$
EQUATION 2
$$M_h \dot{T}_h = (T_d - T_h) / \theta_{d-h} + (T_s - T_h) / \theta_{h-s} + P_h$$
EQUATION 3
$$M_s \dot{T}_s = (T_h - T_s) / \theta_{h-s} + (T_L - T_s) / \theta_{s-L}$$
*Figure 5*
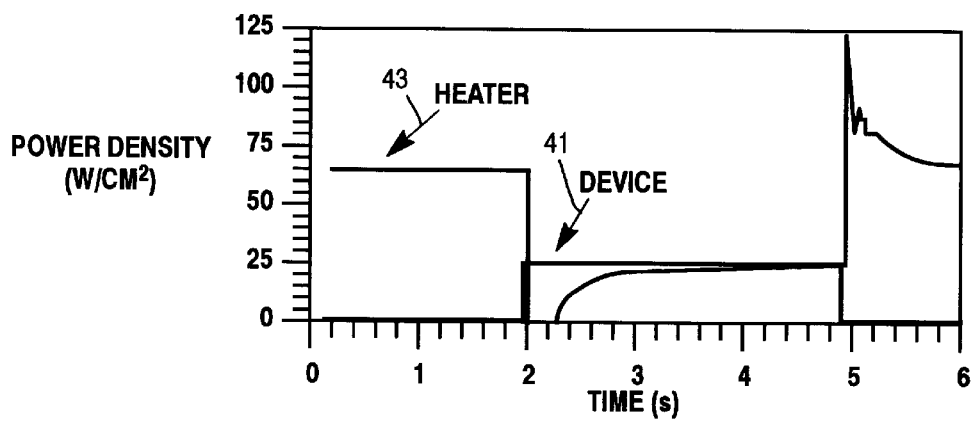
*Figure 6*
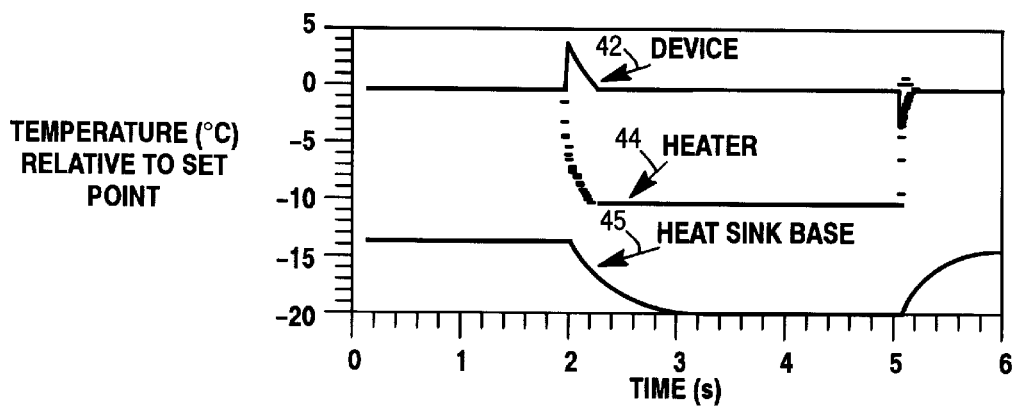
*Figure 7*

EQUATION 11 $\quad M_d \dot{T}_d = (T_h - T_d)/\theta_{d-h} + P_d$

EQUATION 12 $\quad M_h \dot{T}_h = (T_d - T_h)/\theta_{d-h} + (T_1 - T_h)/\theta_{h-1}$ EQUATION 13 $\quad M_1 \dot{T}_1 = (T_h - T_1)/\theta_{h-1} + (T_2 - T_1)/\theta_{1-2} + (T_s - T_1)/\theta_{1-s}$ EQUATION 14 $\quad M_2 \dot{T}_2 = (T_1 - T_2)/\theta_{2-1} + (T_3 - T_2)/\theta_{2-3}$ EQUATION 15 $\quad M_3 \dot{T}_3 = (T_2 - T_3)/\theta_{2-3} + P_h$ EQUATION 16 $\quad M_s \dot{T}_s = (T_1 - T_s)/\theta_{1-s} + (T_L - T_s)/\theta_{s-L}$ EQUATION 20  $\overset{32d}{\downarrow}\ \overset{33c}{\downarrow}\ \overset{32c}{\downarrow}\ \overset{33a}{\downarrow}\ \overset{32a}{\downarrow}$
$M_h \dot{T}_h = - M_s T_s + (T_d - T_h) / \theta_{d-h} + (T_L - T_s) / \theta_{s-L} + P_h$ EQUATION 21  $\overset{67}{\downarrow}\ \overset{65}{\downarrow}\ \overset{63}{\downarrow}\ \overset{61}{\downarrow}\ \overset{60}{\downarrow}$
$M_h \dot{T}_h = - M_1 T_1 - M_2 T_2 - M_3 T_3 - M_s T_s + (T_d - T_h) / \theta_{d-h} + (T_L - T_s) / \theta_{s-L} + P_h$

Figure 10

EQUATION 2  $M_h \dot{T}_h = (T_d - T_h) / \theta_{d-h} + (T_s - T_h) / \theta_{h-s} + P_h$ EQUATION 31  $T_d = T_h + \theta_{d-h} [M_h \dot{T}_h - P_h + (T_h - T_s) \div (\theta_{h-s})]$

Figure 11

EQUATION 2 → $M_h \dot{T}_h = (T_d - T_h) / \Theta_{d-h} + (T_s - T_h) / \Theta_{h-s} + P_h$ with arrows pointing to terms: 32d, 32c, 32b, 32a STEP 1 → let $P_D = 0$ STEP 2 → change $P_h$ STEP 3 → $\begin{cases} \dot{T}_h \text{ varies "slow" if } \Theta_{d-h} \text{ is "small"} \\ \dot{T}_h \text{ varies "fast" if } \Theta_{d-h} \text{ is "large"} \end{cases}$

ELECTRO-MECHANICAL SUBASSEMBLY HAVING A GREATLY REDUCED THERMAL RESISTANCE BETWEEN TWO MATING FACES BY INCLUDING A FILM OF LIQUID, THAT EVAPORATES WITHOUT LEAVING ANY RESIDUE, BETWEEN THE FACES

RELATED CASES

The above-identified invention is related to two other inventions which are described herein with one common Detailed Description. These two other related inventions are:

Docket 550,577 entitled "TEMPERATURE CONTROL SYSTEM FOR AN ELECTRONIC DEVICE WHICH ACHIEVES A QUICK RESPONSE BY INTERPOSING A HEATER BETWEEN THE DEVICE AND A HEAT SINK", filed Apr. 4, 1998 having U.S. Ser. No. 08/833,369; and, Docket 550,578 entitled "TEMPERATURE CONTROL SYSTEM FOR AN ELECTRONIC DEVICE IN WHICH DEVICE TEMPERATURE IS ESTIMATED FROM HEATER TEMPERATURE AND HEAT SINK TEMPERATURE", filed Apr. 4, 1998 having U.S. Ser. No. 08/833,368.

BACKGROUND OF THE INVENTION

This invention relates to temperature control systems which maintain the temperature of an electronic device near a constant set point temperature while the device is being tested; and it relates to subassemblies which comprise key portions of such temperature control systems.

Two specific examples of electronic devices which have a need to be tested near a constant temperature are packaged integrated chips, or bare chips which are unpackaged. Any type of circuitry can be integrated into the chips, such as digital logic circuitry or memory circuitry or analog circuitry. Also, the circuitry in the chips can be comprised of any type of transistors, such as field effect transistors or bipolar transistors.

One reason for trying to keep the temperature of a chip constant while it is tested is that the speed with which the chip operates may be temperature dependent. For example, a chip comprised of complementary field effect transistors (CMOS transistors) typically increases its speed of operation by about 0.3% per ° C. drop in chip temperature.

A common practice in the chip industry is to mass produce a particular type of chip, and then speed sort them and sell the faster operating chips at a higher price. CMOS memory chips and CMOS microprocessor chips are processed in this fashion. However, in order to determine the speed of such chips properly, the temperature of each chip must be kept nearly constant while the speed test is performed.

Maintaining the chip temperature near a constant set point is quite simple if the instantaneous power dissipation of the chip is constant or varies in a small range while the speed test is being performed. In that case, it is only necessary to couple the chip through a fixed thermal resistance to a thermal mass which is at a fixed temperature. For example, if the maximum chip power variation is ten watts, and the coupling between the chip and the thermal mass is 0.2° C./watt, then the chip temperature will vary a maximum of 2° C.

But, if the instantaneous power dissipation of the chip varies up and down in a wide range while the speed test is being performed, then maintaining the chip temperature near a constant set point is very difficult. Each time the device power dissipation makes a big change, its temperature and its speed will also make a big change.

The above problem is particularly severe in CMOS chips because their instantaneous power dissipation increases as the number of CMOS transistors which are switching ON or OFF increases. During the speed test of a CMOS chip, the number of transistors which are switching is always changing; thus, the chip's power dissipation and temperature and speed are always changing. Also, the magnitude of these changes increases as more transistors get integrated into a single chip, because the number of transistors which are switching at any particular instant will vary from none to all of the transistors on the chip.

In the prior art, several temperature control systems for integrated circuit chips have been disclosed by the following U.S. Pat. Nos.:

| | | |
|---|---|---|
| 5,420,521 | 5,297,621 | 5,104,661 |
| 5,315,240 | 5,205,132 | 5,125,656 |
| 5,309,090 | 5,172,049 | 4,734,872. |

However, none of the temperature control systems which are disclosed in the above patents are capable of enabling speed tests to be run on chips which widely vary their power dissipation during the test. This is because the above temperature control systems cannot react fast enough to compensate for such instantaneous power variations.

In the above patent '656 and '661 and '090 and '240, no means are provided for removing heat from the chip; they merely include various heaters for adding heat to the chip. These control systems are suitable only for raising the chip's temperature to an elevated level, such as above 200° C., at which "burn-in" tests are performed. At any elevated temperature, the failure of weak or faulty components in a chip is accelerated, and the "burn-in" test causes such components to fail after several hours.

In the above patents '872 and '132 and '621, the chip temperature is increased or lowered by directing a temperature controlled gas jet at the chip or immersing the chip in a temperature controlled liquid. But, these control systems are limited by the speed at which the temperature of the gas jet or liquid can be increased or decreased.

In patent '521, a control system is disclosed in FIG. 7 which includes both a heater for heating the chip and a liquid cooled aluminum block for cooling the chip. However, the FIG. 7 control system still is not capable of enabling speed tests to be run on chips which widely vary their power dissipation during the test, because it cannot react fast enough to compensate for such power variations. Why this deficiency occurs is explained herein in detail in conjunction with FIGS. 8, 9, and 10.

Accordingly, a primary object of the inventions which are disclosed herein is to provide novel temperature control systems, and novel subassemblies for such systems, which react quickly to large variations in power dissipation within an electronic device and thereby maintain the device temperature near a constant set point temperature while the device is being tested.

BRIEF SUMMARY OF THE INVENTION

In accordance with the invention of Docket 550,579, a temperature control system includes an electromechanical subassembly having an enhanced thermal interface, which comprises: an electronic device which has a face that dissipates heat; a heat exchange member which has a face that mates with the heat dissipating face of the electronic device; and, a film of liquid, lying between the mating faces of the heat exchange member and the electronic device, which evaporates without leaving any residue at a temperature that is too low to damage the electronic device.

Due to the presence of the liquid film, the thermal resistance between the mating faces of the heat exchange member and the electronic device is reduced by over 1000% from which it otherwise is when film is deleted. This in turn closely couples the device temperature to the temperature of the heat exchange member; and thus device temperature is quickly changed by changing the temperature of the heat exchange member. Subsequently, when testing of the electronic device is complete, the film is removed from the device simply by evaporation.

BRIEF DESCRIPTION OF THE DRAWINGS

FIG. 5 is a set of differential equations which precisely defines the behavior of the FIG. 1 control system.

FIG. 6 shows how several parameters vary in the FIG. 1 control system when that system is simulated via the FIG. 5 equations.

FIG. 7 shows how several additional parameters vary in the FIG. 1 control system when that system is simulated via the FIG. 5 equations.

FIG. 10 is a set of differential equations which helps explain another distinguishing feature between the operation of the control systems of FIGS. 1 and 8.

FIG. 11 is a set of differential equations which forms the basis of the temperature control system having Docket 550,578.

DETAILED DESCRIPTION

Figure 1:
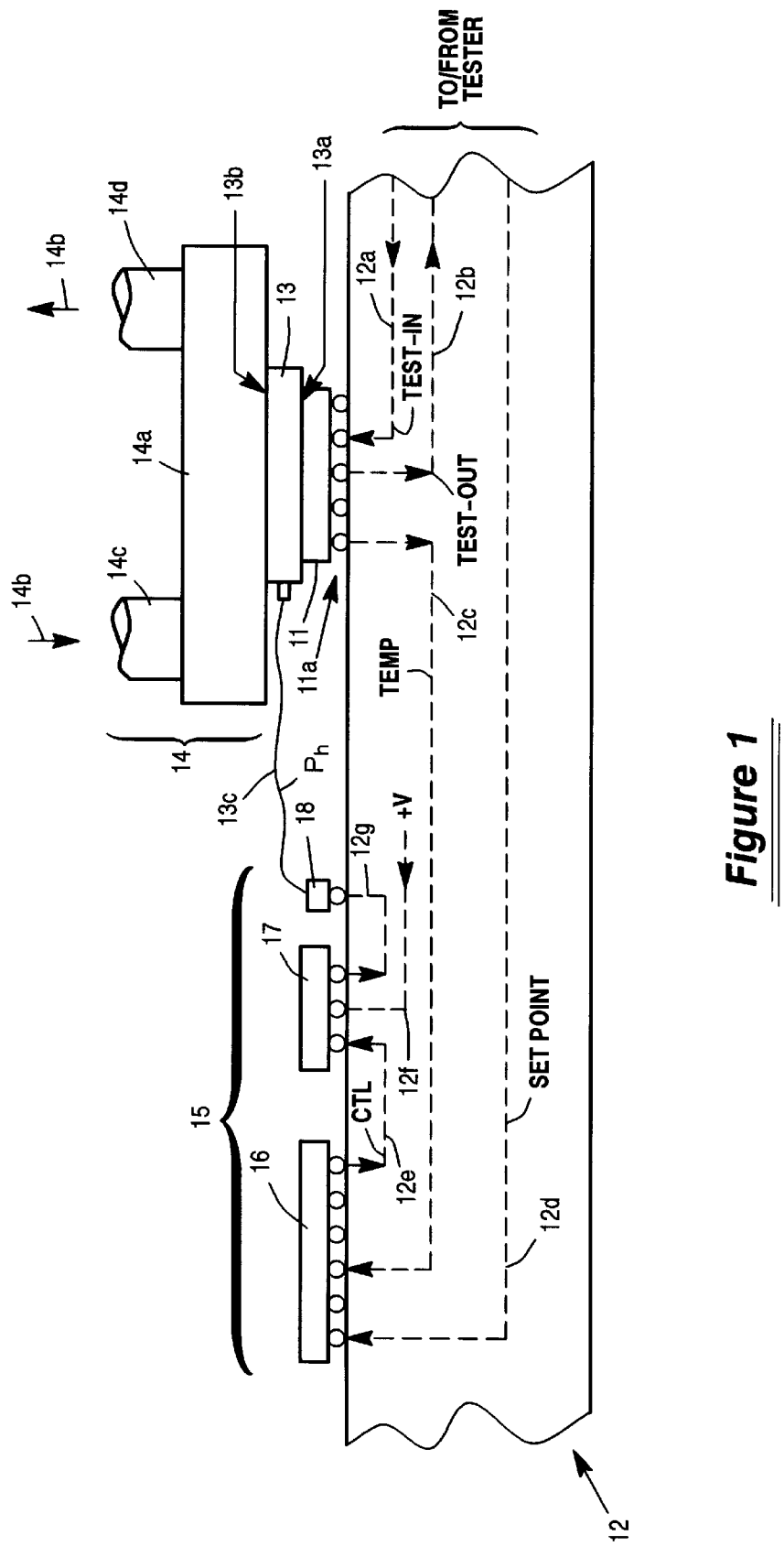
FIG. 1 shows a temperature control system which constitutes a preferred embodiment of the invention having Docket No. 550,577.

In FIG. 1, reference numeral 11 identifies an electronic device which is to be tested while its temperature is maintained near a constant set point. Two specific examples of this electronic device 11 are an integrated chip which is packaged in ceramic or plastic, or a bare chip which is unpackaged. Any type of circuitry which needs to be tested can be integrated into the electronic device 11, such as digital logic circuitry or memory circuitry or analog circuitry; and that circuitry can be comprised of any type of transistors, such as N-channel field effect transistors or P-channel field effect transistors or complimentary field effect transistors or bi-polar transistors.

Included on the electronic device 11 are dozens of input/output terminals 11a; but for simplicity in FIG. 1, only a few of those terminals are shown. These terminals 11a are coupled to three sets of signal lines 12a, 12b, and 12c. On the signal lines 12a, input signals "TEST-IN" are received which test the electronic device 11; and on the signal lines 12b, output signals "TESTOUT" are sent from the electronic device 11 as a response to the test. Conventional test equipment (not shown) is coupled to the signal lines 12a and 12b to respectively send and receive the signals on those lines. On the signal lines 12c, output signals "TEMP" are sent from the electronic device 11 which indicate its temperature. These TEMP signals originate from a temperature sensor, such as a temperature sensitive resistor or diode, which is integrated into the electronic device.

All of the remaining components 12–17 in FIG. 1 constitute a temperature control system which keeps the temperature of the electronic device 11 near the set point while that device is being tested. Each component in this control system is described below in TABLE 1.

TABLE 1

| COMPONENT | DESCRIPTION |
|---|---|
| 12 | Component 12 is a printed circuit board which physically holds the components 11, 16, 17 and 18. Also, the printed circuit board 12 contains several sets of signal and power lines 12a–12g. |
| 13 | Component 13 is a thin, flat electric heater which has two major faces 13a and 13b that lie against components 11 and 14 respectively. A variable amount of electrical power $p_h$ is supplied to the heater 13 via two wires 13c, and that power is dissipated as heat within the heater. One embodiment of the heater 13 is comprised of aluminum nitride ceramic in which electrical resistors (not shown) are uniformly integrated for converting the power from the conductors 13c to heat. |
| 14 | Component 14 is a liquid cooled heat sink that has a hollow base 14a in which cooling fins (not shown) are disposed. A liquid coolant 14b enters the base 14a from a tube 14c, and that liquid coolant exits the base via another tube 14d. This coolant 14b is circulated through the base |

TABLE 1-continued

| COMPONENT | DESCRIPTION |
|---|---|
| | 14a at a constant flow rate by a pump (not shown) and held at a constant temperature $T_L$. |
| 15 | Component 15 is an electronic control circuit which sends the variable amount of electrical power $p_h$ to the electric heater 13. This control circuit 15 consists of a power regulator 16 and a variable power supply 17. |
| 16 | Component 16 is a power regulator which is coupled to three sets of signal lines 12c, 12d, and 12e. The TEMP signals which indicate the present temperature $T_d$ of the electronic device 11 are received on the signal lines 12c, and SET-POINT signals which indicate the set point temperature for the device 11 are received on the signal lines 12d. Based on those two temperatures and their rate of change, power regulator 16 generates control signals CTL on the signal lines 12e which indicate the amount of power that should be sent to the heater 13 such that the temperature of the device 11 stays near the set point. |
| 17 | Component 17 is a variable power supply which is coupled to the signal lines 12e and two sets of power lines 12f and 12g. On the signal lines 12e, the control signals CTL from the power regulator 16 are received, and on the power lines 12f, a supply voltage +V and ground are received. In response to the CTL signals, the power supply 17 sends the variable amount of power $p_h$ on the power lines 12g as a portion of the power which is available from the supply voltage +V. |
| 18 | Component 18 is a connector which intercouples the heater wires 13c to the variable power supply. |

In operation, the electronic device 11 varies in its power dissipation as it is being tested by the TEST-IN signals which it receives on the signal lines 12a. This variation in power occurs because the transistors in the electronic device 11 turn on and off, and thereby vary in their power dissipation, in response to the TEST-IN signals. Consequently, the temperature of the electronic device 11 tends to increase as its power dissipation increases; and vice-versa.

Within the electronic device 11, a temperature sensor generates the TEMP signals on the signal lines 12c which indicate the present temperature of the device. Those TEMP signals are sent to the power regulator 16 where they are compared with the SET-POINT signals on the signal lines 12d. If the temperature of the device 11 is less than the set point temperature, then the regulator 16 generates the control signals CTL such that the variable power $P_h$ to the heater 13 is increased. Conversely, if the temperature of the device 11 is more than the set point temperature, then the regulator 16 generates the control signals CTL such that the variable power PWR to the heater 13 is decreased.

Figure 2:
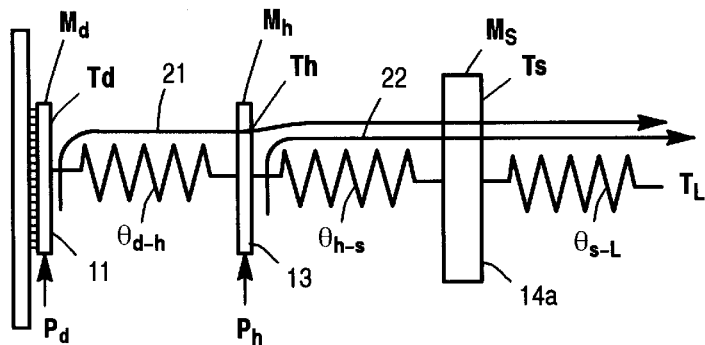
FIG. 2 is a schematic diagram which helps explain the operation of the FIG. 1 temperature control system.
Figure 3:
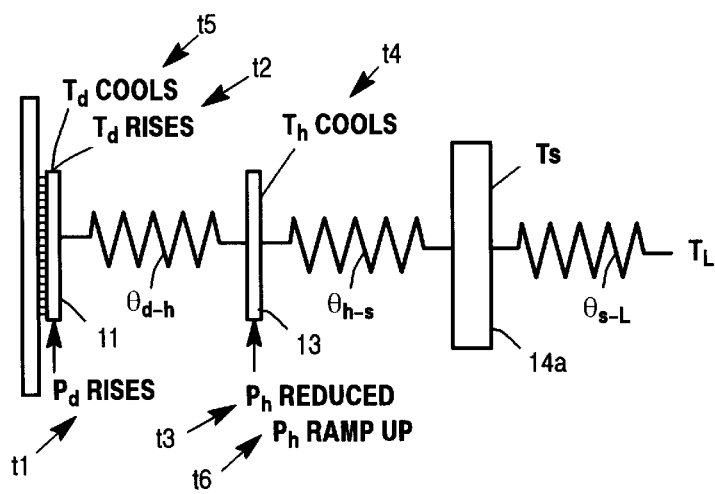
FIG. 3 replicates the schematic diagram of FIG. 2 and depicts the operation of the FIG. 1 control system for the case where the power dissipation in the electronic device steps up.
Figure 4:
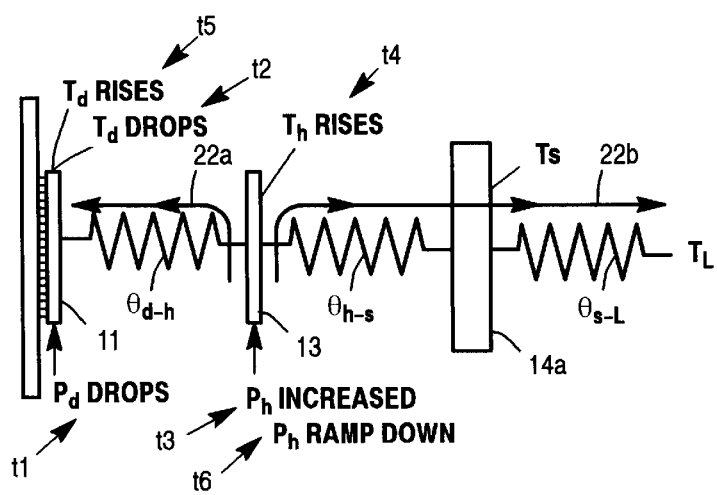
FIG. 4 replicates the schematic diagram of FIG. 2 and depicts the operation of the FIG. 1 control system for the case where the power dissipation in the electronic device steps down.

Turning now to FIGS. 2, 3 and 4, the operation of the FIG. 1 control system will be described in further detail. Those figures are schematic diagrams of the FIG. 1 control system wherein the electronic device 11 is coupled to the electric heater 13 through a thermal resistance $\theta_{d-h}$; the heater 13 is coupled to the heat sink base 14a through a thermal resistance $\theta_{h-s}$; and the heat sink base is coupled to the liquid coolant through a thermal resistance $\theta_{s-L}$. Also in the FIGS. 2–4, the electronic device 11 receives and dissipates a variable amount of power $P_d$, and the electric heater receives and dissipates a variable amount of power $P_h$. Further in the FIGS. 2–4, the electronic device 11 has a temperature $T_d$ and a thermal mass $M_d$; the heater 13 has a temperature $T_h$ and a thermal mass $M_h$; and the heat sink base 14a has a temperature $T_S$ and a thermal mass $M_S$.

Preferably, the heater's thermal mass $M_h$ is made as small as is practical. This constraint, as will be shown below, helps to improve the speed with which the heater 13 can raise or lower its temperature, and thereby maintain the temperature $T_d$ of the electronic device near the set point. One suitable upper limit for the thermal mass $M_h$ is that it be no larger than three times the thermal mass $M_d$ of the electronic device; and preferably, $M_h$ is less than $M_d$.

Also preferably, the heater's thermal resistance $\theta_{d-h}$ is made as small as practical. This constraint, as will be shown below, helps to increase the amount of heat that is transferred from the heater 13 to the electronic device 11, relative to the amount of heat that is transferred from the heater 13 to the heat sink 14. A suitable upper limit for the thermal resistance $\theta_{d-h}$ is that it be no more than three times the thermal resistance $\theta_{h-s}$ between the heater and the heat sink base; and preferably, $\theta_{d-h}$ is less than $\theta_{h-s}$.

Under steady state conditions, heat flows from the device 11 to the liquid coolant along a thermal path 21 as shown in FIG. 2, and heat flows from the heater 13 to the liquid coolant along a thermal path 22 as shown in FIG. 2. Also under steady state conditions, the device temperature equals the set point temperature, and the heater temperature equals the device temperature minus $P_d\theta_{d-h}$. If the device power dissipation is zero, then the heat flow on path 21 is zero and $T_d$ equals $T_h$.

Suppose now that the electronic device 11 increases its power dissipation $P_d$ and thereby causes its temperature $T_d$ to rise above the set point. This is shown in FIG. 3 as occurring at time instants t1 and t2. In response to the rise in the device temperature $T_d$ above the set point, the power $P_h$ to the heater 13 is reduced by the regulator 16; and this is shown in FIG. 3 as occurring at time t3. Heater 13 has a low thermal mass $M_h$; and consequently, the heater's temperature $T_h$ drops rapidly when the heater's power is reduced, as indicated at time t4.

As the heater temperature is reduced, the amount of heat which is transferred from the device 11 along the thermal path 21 to the liquid coolant increases. Thus, the device temperature $T_d$ starts to cool down, as indicated at time t5. As the device temperature $T_d$ approaches the set point, the heater power $P_h$ ramps up as indicated at time t6. Thus the heater temperature $T_h$ rises and thereby reduces the flow of heat from the device 11 along the thermal path 21. By raising the heater power $P_h$ to the proper level, a steady state returns where the heat flow is as shown in FIG. 2 and the device temperature $T_d$ is at the set point.

Conversely, suppose that the electronic device 11 decreases its power dissipation $P_d$ and thereby causes its temperature $T_d$ to drop below the set point. This is shown in FIG. 4 as occurring at time instants t1 and t2. In response to the drop in the device temperature $T_d$ below the set point, the power $P_h$ to the heater 13 is increased by the regulator 16; and this is shown in FIG. 4 as occurring at time t3. Heater 13 has a low thermal mass $M_h$; and consequently, the heater's temperature $T_h$ rises rapidly when the heater's power is increased as indicated at time t4.

If the heater temperature $T_h$ rises so high that it exceeds the device temperature $T_d$, one portion of the heat from the heater travels along the thermal path 22a in FIG. 4 to the electronic device 11, and another portion of the heat from the heater travels along the thermal path 22b to the liquid coolant. Also, the amount of heat which travels on path 22a to the electronic device 11 increases as $\theta_{d-h}$ decreases relative to $\theta_{h-s}$.

In response to the rise in heater temperature at time t4, the device temperature $T_d$ starts to rise, as indicated at time t5. As the device temperature $T_d$ approaches the set point, the heater power $P_h$ ramps down as indicated at time t6. Thus the heater temperature $T_h$ ramps down and thereby reduces the flow of heat from the heater to the device 11 along the thermal path 22a. By dropping the heater power $P_h$ to the proper level a steady state returns where the heat flow is as shown in FIG. 2 and the device temperature $T_d$ is at the set point temperature.

From the above description of FIGS. 2–4, it is seen that the heater 13 controls the amount of heat that flows on the paths 21 and 22a. When $T_h$ equals $T_d$, no heat flows on path 21 or 22a. When $T_h$ is less than $T_d$, then heat flows on path 21 from the electronic device through the heater 13 to the heat sink; and the rate of heat flow increases as $T_d-T_h$ increases. When $T_h$ is more than $T_d$, then heat flows on path 22a from the heater 13 to the electronic device; and the rate of heat flow increases as $T_h-T_d$ increases. By controlling the heater power $P_h$, heat flow to/from the electronic device is regulated; and that in turn regulates the device temperature.

To further explain the speed with which the FIG. 1 control system operates, reference should now be made to FIGS. 5, 6 and 7. In FIG. 5, three differential equations are provided which are labeled equation 1, equation 2, and equation 3. These equations are based on the principle that the sum of the thermal power which is received by a body is equal to the thermal mass of the body times the rate of change of the body's temperature.

Equation 1 contains three terms which are identified by reference numerals 31a, 31b and 31c. Term 31a is the power which the electronic device 11 receives and dissipates in response to the TEST-IN signals; term 31b is the power which is transferred to the electronic device 11 through the thermal resistance $\theta_{d-h}$; and term 31c is the thermal mass of the electronic device 11 times the rate of change of its temperature.

Similarly, equation 2 contains four terms which are identified by reference numerals 32a, 32b, 32c, and 32d. Term 32a is the power which is supplied to the electric heater 13 from the variable power supply 17; term 32b is the power which is transferred to the electric heater 13 through the thermal resistance $\theta_{h-s}$; term 32c is the power which is transferred to the heater 13 through the thermal resistance $\theta_{d-h}$; and term 32d is the thermal mass of the heater times the rate of change of the heater's temperature.

Likewise, equation 3 contains three terms which are identified by reference numerals 33a, 33b, and 33c. Term 33a is the power which is transferred to the heat sink base 14a through the thermal resistance $\theta_{S-L}$; term 33b is the power which is transferred to the heat sink base through the thermal resistance $\theta_{h-s}$; and term 33c is the mass of the heat sink base times the rate of change of its temperature.

Using the three equations of FIG. 5, a simulation on a digital computer was performed; and the results of that simulation are shown in FIGS. 6 and 7. In performing this simulation, the various parameters in the FIG. 5 equations had the values which are shown below in TABLE 2.

TABLE 2

| | |
|---|---|
| $\theta_{d-h}$ = 0.1° C. per watt | $M_d$ = 0.478 joules per ° C. |
| $\theta_{h-s}$ = 0.05° C. per watt | $M_h$ = 0.80 joules per ° C. |
| $\theta_{S-L}$ = 0.1° C. per watt | $M_s$ = 5.60 joules per ° C. |

-continued
TABLE 2

MAXIMUM $P_h$ = 500 watts $T_L$ = 40° C. below set point

Also, the simulation assumed that the electronic device 11 was initially at the set point temperature and was dissipating no power. Thereafter, at a time equal to two seconds, the power dissipation of the electronic device 11 was stepped up in response to the TEST-IN signals, to a power of 100 watts. This power dissipation remained constant in the electronic device 11 for three seconds at which time the power dissipation in the device 11 went back to zero.

By changing the power dissipation of the electronic device 11 with a pair of one hundred watt steps as described above, the ability of the FIG. 1 control system to maintain the device temperature near the set point is tested under a worst case condition. Also, the thermal mass $M_d$ in TABLE 2 is the thermal mass of a bare integrated circuit chip; and thus, it constitutes another worst case test condition because its temperature will change temperature faster than the temperature of a packaged chip (which inherently has a larger thermal mass).

Curve 41 in FIG. 6 shows how the power dissipation in the electronic device 11 changes with time, as described above. Also in FIGS. 6 and 7, curve 42 shows how the temperature of the electronic device 11 changes with time; curve 43 shows how the heater power changes with time; curve 44 shows how the heater's temperature changes with time; and curve 45 shows how the temperature of the heat sink base changes with time.

Inspection of curve 42, at time equal to two seconds, shows that the maximum deviation in the temperature of the electronic device 11 is approximately 4° C. due to the step increase in power dissipation within that device. After reaching that maximum temperature deviation, the temperature of the electronic device 11 then ramps down and returns to the set point within about 0.4 seconds.

Similarly, inspection of curve 42, at time equal to five seconds, shows that the maximum deviation in the temperature of the electronic device 11 is approximately 3.6° C. due to the negative step in power dissipation within that device. After reaching that maximum temperature deviation, the temperature of the electronic device 11 ramps up and returns to the set point within 0.3 seconds.

One primary feature of the above-described control system is the speed with which the control system corrects a deviation in the device temperature from the set point, and thus keeps the maximum deviation relatively small. How this speed of operation is achieved can be seen from the equations in FIG. 5 as follows.

Each deviation in the device temperature from the set point is corrected by a change in the heater power $P_h$ as given by term 32a in equation 2. When term 32a changes, the temperature of the heater changes as indicated by term 32d in equation 2. A change in heater temperature then causes term 31b to change in equation 1. Then the change in term 31b causes the device temperature to change as indicated by term 31c in equation 1. In FIG. 5, the above chain of events is indicated by a dashed line 51.

By comparison, in the prior art U.S. Pat. No. 5,420,521 the chain of events which occur between a change in the heater power and a resulting change in the device temperature is much longer; and this is shown by FIGS. 8 and 9.

Figures 8, 9:
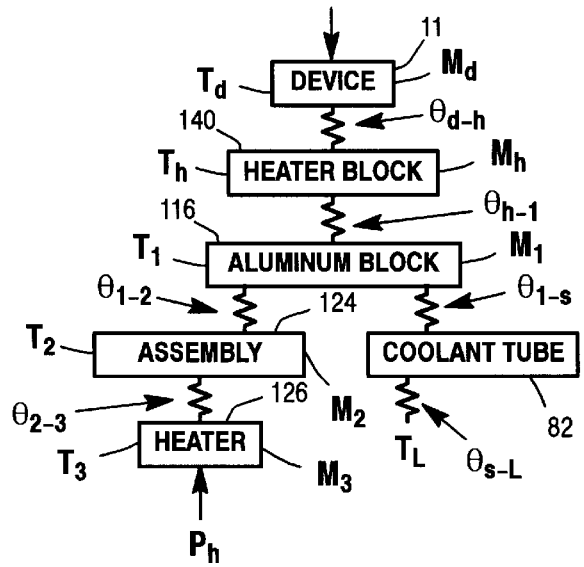
FIG. 8 is a schematic diagram, similar to the schematic diagram of FIG. 2, which helps explain the operation of a prior art temperature control system that is described in U.S. Pat. No. 5,420,521.
FIG. 9 is a set of differential equations which precisely defines the behavior of the FIG. 8 temperature control system and help explain a distinguishing feature between the operation of the control systems of FIGS. 1 and 8.

FIG. 8 is a schematic diagram for the control system which occurs in FIGS. 7 and 8 of the prior art patent '521. In this schematic diagram, the reference numerals 140, 116, 124, 126, and 82 are the same reference numerals which occur in FIG. 7 of patent '521.

Component 140 is a heater block which contacts the electronic device 11 that is to be cooled; component 116 is an aluminum block which contacts the heater block; component 82 is a coolant tube which carries a liquid coolant at a temperature $T_L$; component 124 is a heater assembly which contacts the aluminum block 116; and component 126 is a heating element in the heater assembly. Each component in FIG. 8 has a respective thermal mass M and a respective temperature T as shown in the figure. Also, all of the components in FIG. 8 are intercoupled through respective thermal resistance's $\theta$ as shown.

From the schematic diagram of FIG. 8, a set of six differential equations 11–15 can be derived as shown in FIG. 9. These FIG. 9 equations are similar to the equations of FIG. 5 is that they are based on the principle that the sum of the thermal power which is received by a body is equal to the thermal mass of the body times the rate of change of the body's temperature.

When the heater power $P_h$ in equation 15 changes, that causes the temperature $T_3$ to change as indicated by term 61 in equation 15. A change in the temperature $T_3$ then causes term 62 to change in equation 14. Then the change in term 62 causes the temperature $T_2$ to change as indicated by term 63 of equation 14. A change in the temperature $T_2$ then causes term 64 to change equation 13. Then the change in term 64 causes the temperature $T_1$ to change as indicated by term 65 of equation 13. A change in the temperature $T_1$ then causes term 66 to change in equation 12. Then the change in term 66 causes the temperature $T_h$ to change as indicated by term 67 of equation 12. A change in the temperature $T_h$ then causes term 68 to change in equation 11. Then the change in term 68 causes the device temperature $T_d$ to change as indicated by term 69 of equation 11.

In FIG. 9, the above chain of events is indicated by reference numeral 51'. In this chain of events 51', each of the temperatures $T_3$, $T_2$, $T_1$, $T_h$, and $T_d$ must sequentially change in order to regulate the device temperature by varying the heater power $P_h$. Consequently, varying the heater power only indirectly changes the device temperature. By comparison, in the chain of events 51 in FIG. 5, only the temperatures $T_h$ and $T_d$ must sequentially change in order to regulate the device temperature by varying the heater power. Consequently, varying the heater power in the FIG. 1 control system affects the device temperature much more directly, and thus more quickly, than it does in patent '521.

Another reason why varying the heater power in the FIG. 1 control system effects the device temperature more quickly than it does in patent '521 can be seen from equations 20 and 21 in FIG. 10. Equation 20 is formed by adding equations 2 and 3 of FIG. 5 together, and by rearranging the resulting terms such that only term 32d lies to the left of the equal sign. Similarly, equation 21 is obtained by adding equations 12–16 of FIG. 9 together, and by rearranging the resulting terms such that only term 67 lies to the left of the equal sign.

In term 32d of equation 20, the thermal mass $M_h$ is the thermal mass of the FIG. 1 heater 13 which is in direct contact with the electronic device 11 that is to be cooled. Similarly, in term 67 of equation 21, the thermal mass $M_h$ is the thermal mass of the FIG. 8 heater block 140 which is in direct contact with the electronic device 11 that is to be cooled. Thus, in order to regulate the temperature of the electronic device 11 quickly, it is critical that the temperature $T_h$ of the mass $M_h$ can be changed quickly by varying the heater power $P_h$.

When the heater power $P_h$ increases in equation 20, the effect of that power increase on the temperature $T_h$ of the mass $M_h$ is diminished by the negative term 33c which occurs in the right-hand side of equation 20. By comparison, when the heater power $P_h$ in equation 21 is increased, the effect of that power increase on the temperature $T_h$ of the mass $M_h$ is diminished by four negative terms 60, 61, 63, and 65 in the right-hand side of equation 21.

Term 60 in equation 21 is similar to term 33c in equation 20; and thus their negative effects on changing the temperature $T_h$ by varying the heater power $P_h$ are similar. But the remaining negative terms 61, 63, and 65 in equation 21 are completely eliminated in equation 20. Thus, changing the heater power $P_h$ has a much larger effect on the rate of change of the temperature $T_h$ in the FIG. 1 control system than it does in patent '521.

Figure 12:
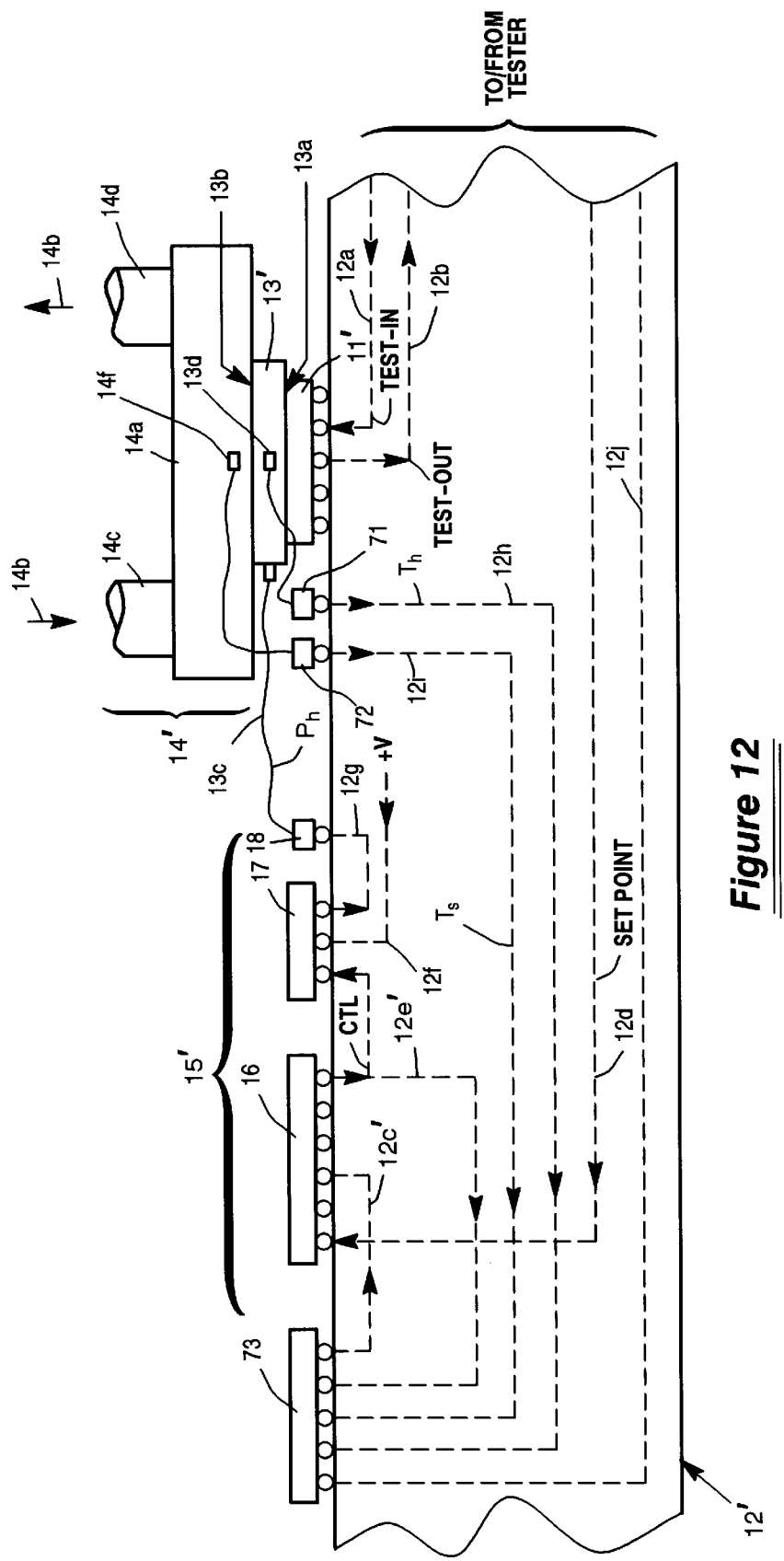
FIG. 12 shows a preferred embodiment of the temperature control system which is based on the FIG. 11 equations.

Turning now to FIGS. 11 and 12, a second temperature control system will be described. A major point of distinction in this second temperature control system over the FIG. 1 system is that it regulates the temperature of an electronic device 11' which does not include a temperature sensor. Consequently, the electronic device 11' is unable to generate the temperature signals TEMP which indicate how its temperature is varying in response to the TEST-IN signals on the signal lines 12a. This distinguishing point is very significant since many, if not most, integrated circuit chips in the prior art do not include a temperature sensor.

Equation 2, as previously described, provides the principle on which this second temperature control system is based; and for convenience equation 2 is reproduced in FIG. 11. By algebraically rearranging the terms of equation 2, another equation 31 is obtained wherein the device temperature $T_d$ is expressed in terms of several parameters which are on the right of the equals sign.

In equation 31, the parameters $T_h$, $\dot{T}_h$, $P_h$, and $T_s$ vary with time as each particular device 11' is being tested; and the remaining parameters $\theta_{d-h}$, $M_h$, and $\theta_{h-s}$ are essentially constant. Thus, from equation 31, the device temperature $T_d$ can be estimated by measuring the constant parameters $\theta_{d-h}$, $M_h$, and $\theta_{h-s}$ before the device 11' is tested and by sensing the parameters $T_h$, $\dot{T}_h$, $P_h$, and $T_s$ while the device 11 is tested. Then, if the estimated device temperature is above the set point, the heater temperature is decreased; and vice-versa.

FIG. 12 shows all of the components of a temperature control system which operates on the above principle. In FIG. 12, the heater 13' is the same as the heater 13 of FIG. 1, except that it includes a sensor 13d which senses the heater temperature Th. Similarly in FIG. 12, the heat sink 14' is the same as heat sink 14 of FIG. 1 except that it includes a sensor 14f which senses the heat sink temperature $T_s$.

Component 12' in FIG. 12 is the same as the printed circuit board 12 in FIG. 1, except that it includes five different sets of signal lines 12c', 12e', 12h, 12i and 12j, plus two connectors 71 and 72. Signal lines 12h carry the sensed heater temperature $T_h$; signal lines 12i carry the sensed heat sink temperature Ts; signal lines 12j carry the measured parameters $\theta_{d-h}$, $M_h$, and $\theta_{h-s}$; signal lines 12e' carry the control signals CTL which indicate the heater power $P_h$; and signal lines 12c' carry the estimated device temperature $T_d$.

Component 73 in FIG. 12 estimates the device temperature based on equation 31 and all of the parameters which it receives on the signal lines 12e', 12i, 12j and 12h. Component 73 can be a digital microprocessor chip which digitally calculates the device temperature from equation 31; or alternatively, component 71 can be an analog circuit which calculates the device temperature from equation 31 in an analog fashion.

Components 16, 17 and 18 are identical to those components in FIG. 1 which have the same reference numeral. Components 16, 17 and 18 together constitute a control circuit 15' which receives an estimated device temperature on the signal lines 12c', and receives the set point temperature on the signals lines 12d. When the estimated device temperature exceeds the set point temperature, the control circuit 15' reduces the power $P_h$ to the heater 13'; and vice-versa.

Figure 13:
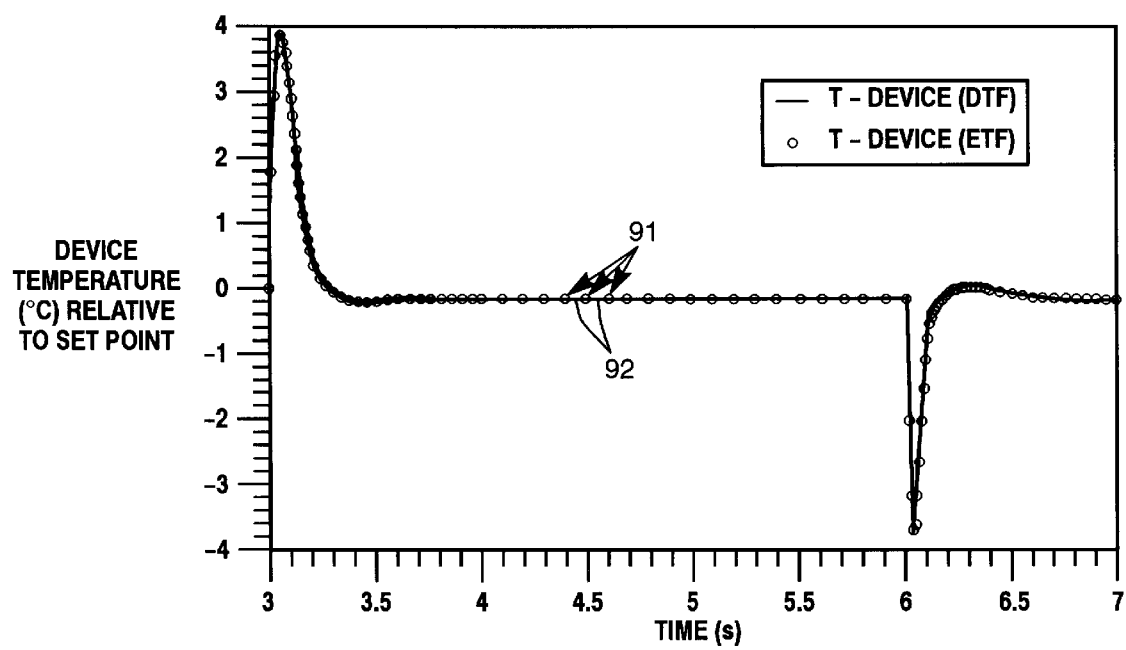
FIG. 13 is a set of curves which is obtained by a simulation of the FIG. 12 temperature control system.

A digital simulation of the FIG. 12 temperature control system is shown in FIG. 13. In this simulation, the electronic device 11' had a step increase in power when the simulation time equaled three seconds, and it had a step decrease in power when the simulation time equaled six seconds. Curve 91 in FIG. 13, (which is comprised of a series of small circles), shows how the estimated device temperature varied with time during the simulation; and curve 92 in FIG. 13, (which is a solid line), shows how the actual device temperature would be sensed if the device had a temperature sensor.

When the above simulation of FIG. 13 was performed, it was assumed that all of the parameters on the right-hand side of equation 31 were sensed or measured with no errors. This is a valid assumption for $\theta_{h-s}$ and $M_h$ because they are essentially fixed and can be measured accurately. Also $T_h$ and $T_s$ can be made as accurate as desired by using proper temperature sensors, and $P_h$ is known from the control signal CTL. But in a mass production environment, where many electronic devices are tested one at a time, the parameter $\theta_{d-h}$ may vary within some range from an average value due to microscopic variations in physical contact between the heater 13' and each device 11'.

Figure 14:
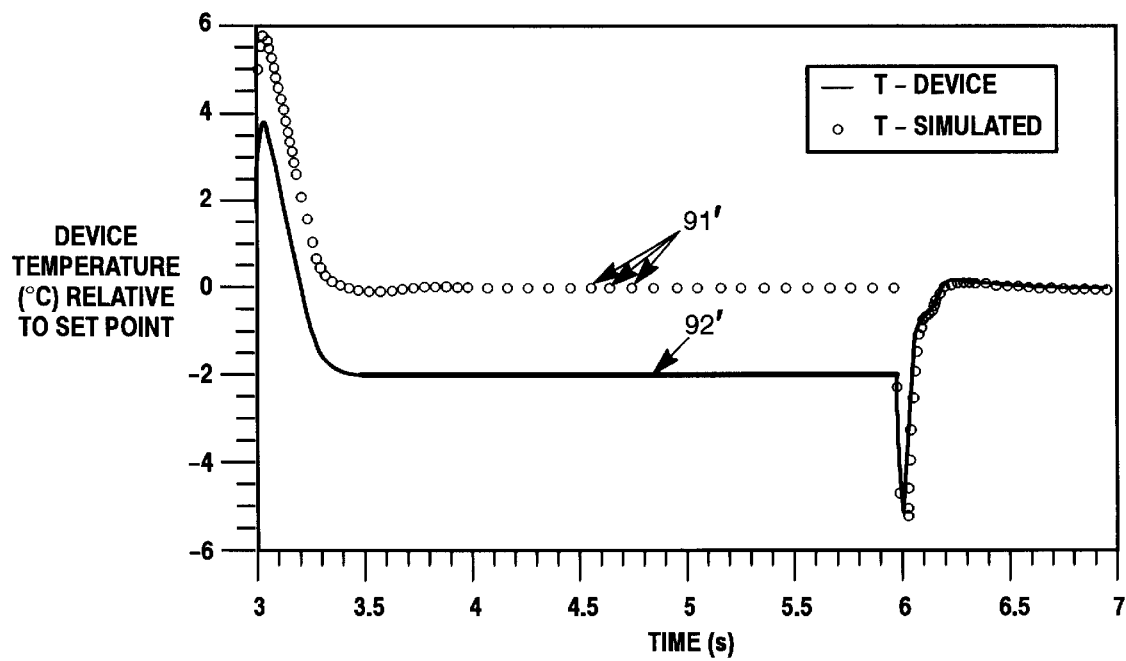
FIG. 14 is another set of curves which is obtained by a second simulation of the FIG. 12 temperature control system in which a particular parameter is injected with an error.

If an average value of $\theta_{d-h}$ is sent to the estimator component 73, but the actual value of $\theta_{d-h}$ differs from that average value, then an error in the estimated device temperature will occur. As a result, an offset will occur between the actual temperature of the device 11' as regulated by the FIG. 12 control system and the set point temperature. This is evident from FIG. 14 where a curve 91', (which is comprised of a series of small circles), shows how the estimated device temperature varies with time when the actual $\theta_{d-h}$ is 20% smaller than the average $\theta_{d-h}$; and a curve 92', (which is a solid line), shows how the actual device temperature varied with time.

When certain types of devices 11' are tested, some offset between the actual device temperature and set point temperature may be acceptable, in which case it is sufficient to send the average value of $\theta_{d-h}$ to the estimator 73. If, however, the amount of offset is not acceptable, then the offset can be reduced by measuring the actual $\theta_{d-h}$ for each device that is tested.

Figures 15, 16:
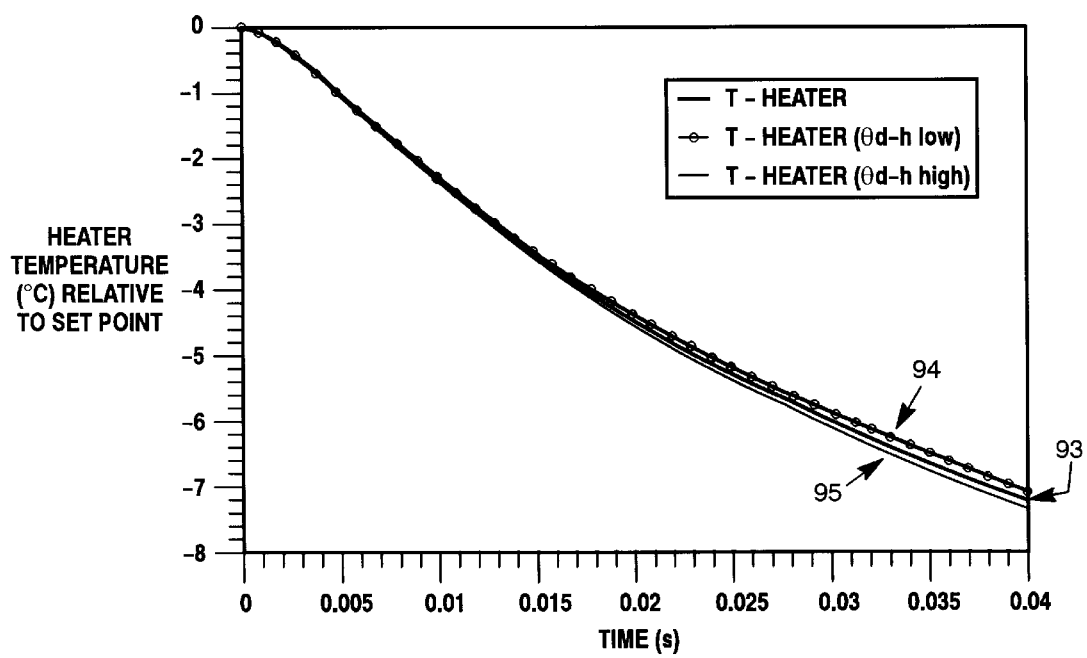
FIG. 15 lists the steps of a process by which the error in the parameter of FIG. 14 can be detected and corrected.
FIG. 16 illustrates how the FIG. 15 process is carried out.

One preferred method by which the actual $\theta_{d-h}$ can be measured for each device is shown in FIGS. 15 and 16. This method, which includes steps 1–3, is based on equation 2, which again is reproduced in FIG. 15. If $\theta_{d-h}$ is smaller than its average value, then $T_d-T_h$ will decrease. Thus term 32c will decrease, and so the rate of change of heater temperature in term 32d will decrease. Conversely, if $\theta_{d-h}$ is larger than its average value, then the rate of change of heater temperature in term 32d will increase.

In step 1 of the FIG. 15 process, the power dissipation of the device 11' is set to zero. Then in step 2, the heater power $P_h$ is varied in some predetermined fashion. Suitably, the heater power is stepped up, or stepped down, or varied as a sine wave. Next in step 3, the effect which varying the heater power has on $\dot{T}_h$ is sensed and correlated to $\theta_{d-h}$. If $T_h$ varies faster than average, then the actual $\theta_{d-h}$ is larger than its average value; whereas if $T_h$ varies slower than average, then $\theta_{d-h}$ is smaller than its average value. This is indicated in FIG. 16 by curves 93, 94, and 95. Curve 93 was obtained by setting $\theta_{d-h}$ equal to its average value, raising $P_h$ to the set point and waiting until the device temperature reached the set point, and then dropping $P_h$ to zero. Curves 94 and 95 were similarly obtained but the actual $\theta_{d-h}$ deviated from the average $\theta_{d-h}$ by 20%.

To measure the actual value of $\theta_{d-h}$ for any deviation from the average, the heater temperature is sensed at some time after $P_h$ drops to zero, such as at time equal to 0.04 seconds. Then by extrapolation from the curves 93, 94 and 95, the actual $\theta_{d-h}$ is obtained.

Next, with reference to FIGS. 17–19, a preferred process for minimizing the thermal resistance $\theta_{d-h}$ in the temperature control systems of FIGS. 1 and 12 will be described. This process is significant because as $\theta_{d-h}$ is reduced, the amount of heat that can be transferred from the heater to the electronic device increases relative to the amount of heat that is transferred from the heater to the heat sink. Such heat transfers occur when the heater temperature exceeds the device temperature, as was explained previously in conjunction with FIG. 4.

If a dry contact is made between the electronic device 11 (or 11') and the heater 13 (or 13'), and the contacting surfaces are very flat (i.e., less than 5 $\mu$m deviation from a perfect plane), then the typical resistivity which can be obtained between the contacting surfaces is about 1.3° C. cm²/watt. This resistivity will be larger if the contacting surfaces are less flat. Placing a thermal pad between two non-flat surfaces reduces the resistivity between them, but a practical resistivity which an be obtained through a thermal pad is about 1.0° C. cm²/watt. By comparison, with the method of FIGS. 17–19, the resistivity from the electronic device to the heater has been reduced to 0.07° C. cm²/watt. This is an improvement of 1.0÷0.07, which is more than 1000%.

Figure 17:
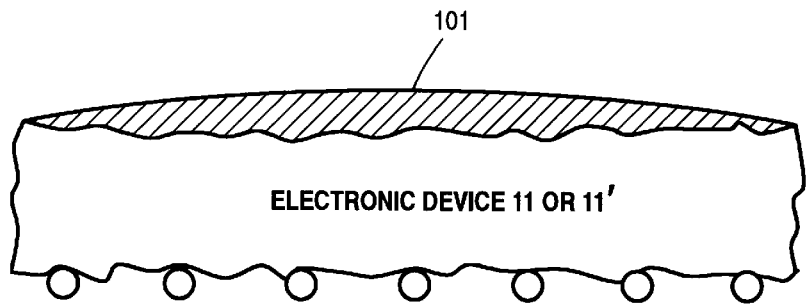
FIG. 17 shows an initial stage of fabricating a subassembly which constitutes the invention having Docket No. 550,579.
Figure 18:
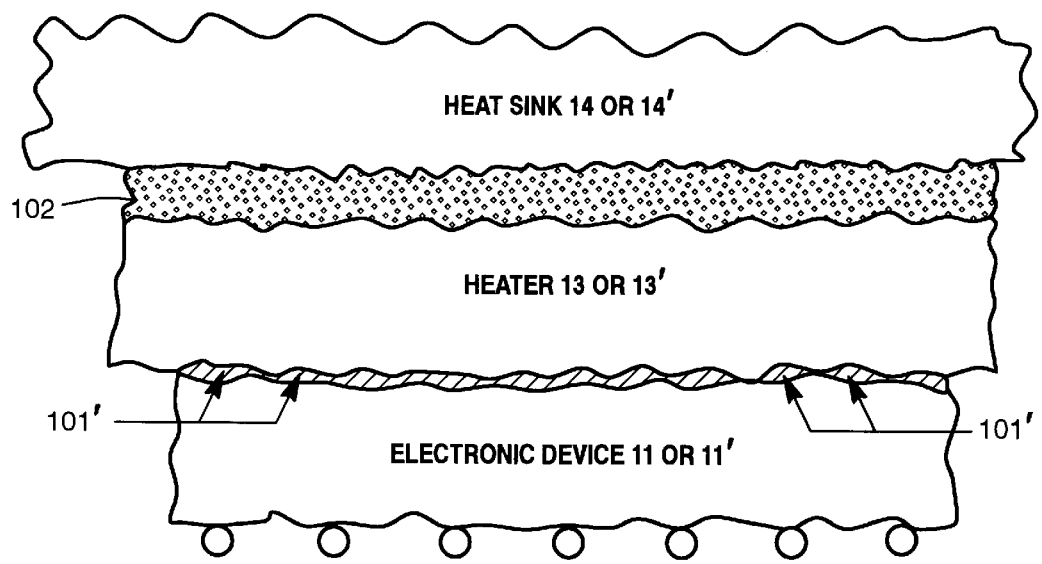
FIG. 18 shows how the subassembly of FIG. 17 is completed and incorporated into the temperature control systems of FIGS. 1 and 12.
Figure 19:
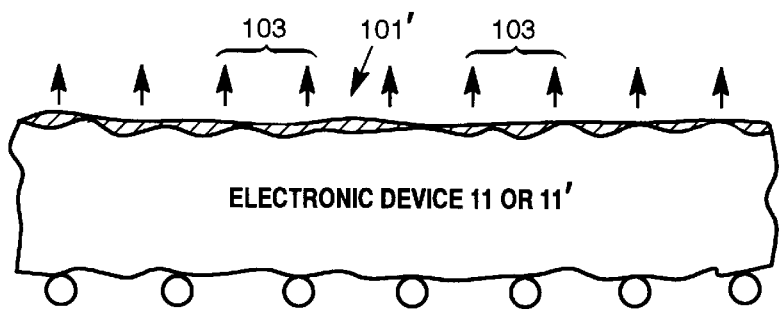
FIG. 19 shows how a film on an electronic device in the subassembly of FIG. 18 is removed.

Initially in the process of FIGS. 17–19, a drop of a particular type of liquid 101 is dispensed onto the surface of the electronic device 11 (or 11') which is to make contact with the heater 13 (or 13'). This step is shown in FIG. 17. Two limiting characteristics of the liquid 101 are—a) that it is a good thermal conductor relative to air, and b) that it evaporates, without leaving any residue, at a temperature which is too low to damage the electronic device. Preferably, the liquid 101 evaporates at a temperature of less than two hundred degrees centigrade.

One preferred embodiment of the liquid 101 is water. A second embodiment of the liquid 101 is a mixture of water and a volatile material (e.g. ethylene glycol) which elevates the boiling point of the mixture above the boiling point of water. A third embodiment of the liquid 101 is a mixture of water and a volatile material (e.g. methanol) which suppresses the freezing point of the mixture below the freezing point of water. A fourth embodiment of the liquid 101 is a mixture of water and a volatile material (e.g. ethanol) which enhances the wetability of the mixture above the wetability of water.

After the liquid 101 is dispensed on the electronic device as described above, surface 13a of the heater is pressed against that liquid. This step is shown in FIG. 18. As a result, some of the originally dispensed liquid 101 is squeezed out, and the remaining liquid 101' fills the microscopic gaps which inherently exist between the electronic device and the heater. These gaps occur because surface 13a of the heater and the mating surface of the electronic device are not perfectly flat.

Due to the presence of the liquid 101', the thermal resistivity from the heater 13 (or 13') to the electronic device 11 (of 11') is substantially reduced over that which it would otherwise be without the liquid. When the liquid 101' is water and the flatness of the mating surfaces is less than 5 μm, then the above-described resistivity of about 0.07° C. cm²/watt is obtained.

One way to reduce the size of the gaps between the mating surfaces of the electronic device and the heater is to increase the pressure with which those two surfaces are pushed together; and this in turn will tend to decrease θd–h. But, if too much pressure is applied, the electronic device or an interconnect to it can crack. Thus, for the case where the electronic device is a bare integrated circuit die, the pressure between it and the heater preferably is less than 10 psi.

FIG. 18 also shows that the mating surfaces between the heater and the heat sink are not perfectly flat. But those two surfaces preferably are joined in a permanent fashion, for example by a layer 102 of thermally conductive epoxy. A suitable thickness for the layer 102 is 50 μm–80 μm.

While the electronic device and the heater and the heat sink are all coupled together as shown in FIG. 18, the electronic device is tested and its temperature is kept near the set point by the control systems of FIGS. 1 or 12. Thereafter, when the test is complete, the electronic device is separated from the heater. Then the liquid 101' is removed from the electronic device by evaporation; and this is indicated by the arrows 103 in FIG. 19.

The total time which it takes to evaporate all of the liquid 101' is proportional to the area of the liquid 101' which is exposed. If the electronic device is square with a dimension L on each side, then the exposed area in FIG. 19 is L. By comparison, when the electronic device is being tested in the FIG. 18 structure, the exposed area of the liquid 101' is greatly reduced to (4 L) (5 μm).

If the electronic device is a typical integrated circuit chip, then L is less than one-half inch. In that case, the liquid 101' evaporates more than 500 times slower in the FIG. 18 structure than it does in FIG. 19. Thus, during short tests (i.e., less than one hour) no significant amount of liquid 101' will be lost from the FIG. 18 structure due to evaporation.

One feature of the above process is that after the liquid 101' is evaporated, no residue remains on the electronic device. Consequently, the electronic device can be put into an end product without any additional clean-up steps.

Another feature of the above process is that it is very easy and inexpensive to perform. Only one step is needed to dispense a drop of the liquid 101 on the electronic device as shown in FIG. 17, and only one step is needed to push the heater against the electronic device as shown in FIG. 18.

Three separate, but related, inventions have now been described in detail in conjunction with FIGS. 1–10, FIGS. 11–16, and FIGS. 17–19 respectively. In addition, various changes and modifications can be made to the details of these Figs. without departing from the nature and spirit of the inventions.

Figure 20:
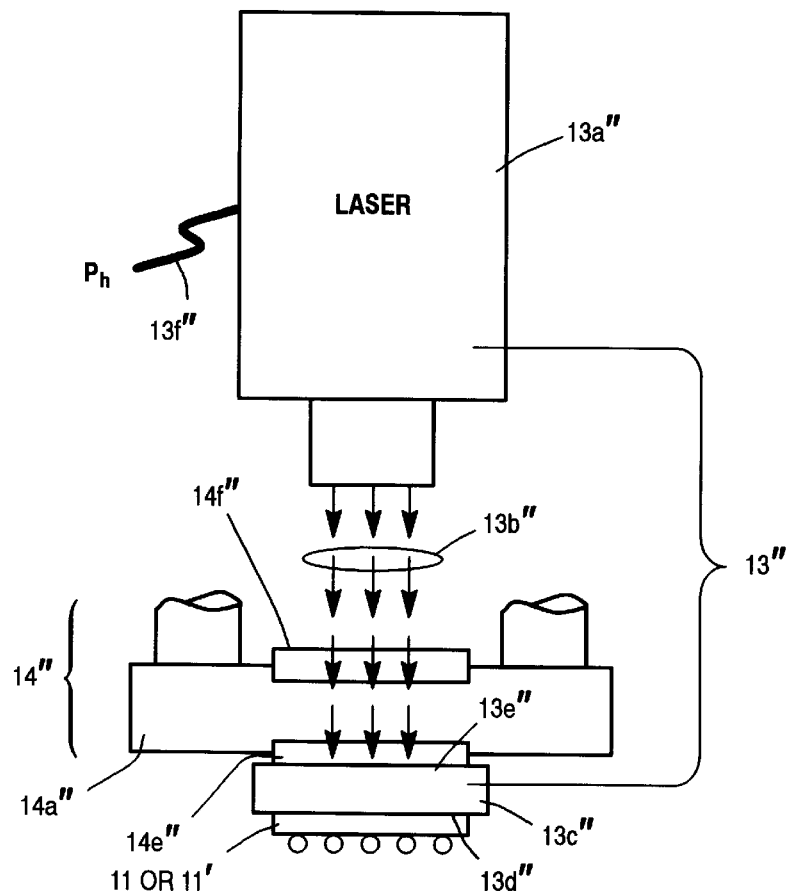
FIG. 20 shows a modification for a heater component within the temperature control systems of FIGS. 1 and 12.

For example, FIG. 20 shows a modification wherein the temperature of the electronic device 11 (or 11') is kept near the set point by the use of a laser. This FIG. 20 modification can be incorporated into the temperature control systems of the previously described FIGS. 1, 12, and 18.

In FIG. 20, reference number 13" identifies a modified electric heater; and reference number 14" identifies a modified heat sink. Included in the modified heater 13" is a laser 13a" which generates an infrared laser beam 13b", and a thin, flat piece of infrared laser beam absorbing material 13c". This material 13c" has two major faces 13d" and 13e" which respectively lie against the electronic component 11 (or 11') and the heat sink 14".

The modified heat sink 14" is the same as the previously described heat sinks of FIGS. 1 or 12, except that the base 14a" includes two windows 14e" and 14f", and no cooling fins are disposed in the base between the windows. Window 14e" is transparent to the infrared laser beam 13b" and is thermally conductive. Window 14f" also is transparent to the laser beam 13b", but it need not be thermally conductive. Suitably, the windows are made of monocrystalline silicon.

In operation, the temperature of the electronic device 11 (or 11') is either sensed directly as per the FIG. 1 control system, or estimated as per the FIG. 12 control system. Then, if the device temperature $T_d$ is above the set point, the power $P_h$ to the laser on lines 13f" is reduced by the control circuit 15 of FIG. 1, or by the control circuit 15' of FIG. 12. Conversely if the device temperature is below the set point, the power $P_h$ to the laser is increased.

Figure 21:
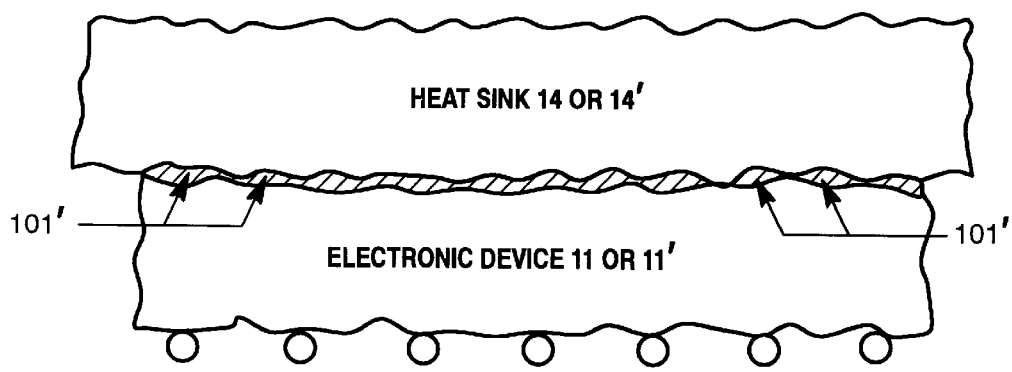
FIG. 21 shows a modification for the subassembly of FIG. 18.

As another modification, the enhanced thermal interface of FIG. 18 can be incorporated into a temperature control system other than the one of FIGS. 1 and 12. An example of this modification is shown in FIG. 21. In the FIG. 1 control system the heater 13 (or 13' or 13") and the corresponding circuitry for controlling the heater power $P_h$ is eliminated; and the heat sink 14 (or 14') is pressed against the electronic device with the liquid film 101' disposed there between.

With the FIG. 21 modification, the temperature of the electronic device 11 (or 11') will vary substantially more from the set point than it does when the heater 13 ( or 13' or 13") is present. But on the other hand, the temperature of the electronic device will vary substantially less with the FIG. 21 modification than the variation which occurs if the liquid film 101' is absent. For particular tests on particular electronic devices, such as chips with a small variation in power dissipation, the amount of temperature regulation which is achieved with the FIG. 21 modification will be sufficient; and all costs associated with the heater and its control circuits are eliminated.

As another modification, the temperature control system of FIG. 1 can be changed to an open loop control system in which the electronic device 11 does not send any TEMP signals to the power regulator 16. With this modification, the tester sequentially sends a series of predicted temperatures on the signals lines 12d to the power regulator 16 for each particular TEST-IN signal which it sends to the electronic device 11. In response, the power regulator 16 compares the predicted temperature of electronic device 11 with the set point temperature. If the predicted temperature is less than the set point temperature, then the regulator 16 generates the control signals CTL such that the variable power $P_h$ to the heater 13 is increased. Conversely, if the predicted temperature is more than the set point temperature, then the regulator 16 generates the control signals CTL such that the variable power $P_h$ to the heater 13 is decreased.

As still another modification, the electric heater 13" of FIG. 20 can be changed such that the infrared laser beam absorbing material 13c" is eliminated. With this modification, the window 14e" lies against the electronic device 11 (or 11'); and the laser beam 13b" is absorbed directly by the electronic device.

As another modification, the FIG. 1 temperature control system can be changed such that the TEMP signals on the signal lines 12c originate from a temperature sensor that is attached to the external surface of the electronic device 11. This modification is useful when a temperature sensor is not integrated into the electronic device 11.

As another modification, the FIG. 1 and FIG. 12 temperature control systems can be changed such that the set point temperature on the signal lines 12d varies with time. For example, the set point temperature can be stepped from one level to another, or it can vary continuously in a ramped or sinusoidal fashion.

Accordingly, it is to be understood that the present inventions are not limited to the details of any one embodiment in any one figure, but are defined by the appended claims.

What is claimed is:

1. An electromechanical subassembly having an enhanced thermal interface, comprising:
   an electronic device which has a face that dissipates heat;
   a heat exchange member which has a face that mates with said face on said electronic device;
   a film of liquid, lying between said mating faces of said heat exchange member and said electronic device, which evaporates without leaving any residue at a temperature that is too low to damage the electronic device; and,
   said subassembly being open around said electronic device such that any portion of said liquid which evaporates will escape from said subassembly.

2. A system according to claim 1 wherein said liquid is water.

3. A system according to claim 1 wherein said liquid is a mixture of water and a volatile material which elevates the boiling point of said mixture above the boiling point of water.

4. A system according to claim 1 wherein said liquid is a mixture of water and a volatile material which suppresses the freezing point of said mixture below the freezing point of water.

5. A system according to claim 1 wherein said liquid is a mixture of water and a volatile material which enhances the wetability of said mixture above the wetability of water.

6. A system according to claim 1 wherein said liquid evaporates at a temperature of less than two hundred degrees centigrade.

7. A system according to claim 1 wherein said heat exchange member is cooler than said electronic device.

8. A system according to claim 1 wherein said heat exchange member is cooled with a liquid.

9. A system according to claim 1 wherein said heat exchange member is hotter than said electronic device.

10. A system according to claim 1 wherein said heat exchange member is an electronic heater.

11. A system according to claim 1 wherein said heat exchange member has a thermal mass which is at least ten times larger than the thermal mass of said electronic device.

\* \* \* \* \*